United States Patent [19]

Nomiya et al.

[11] 3,818,441

[45] June 18, 1974

[54] KEY INPUT CIRCUIT SYSTEM FOR ELECTRONIC APPARATUS

[75] Inventors: Kosei Nomiya; Takao Tsuiki, both of Tokyo, Japan

[73] Assignee: Hitachi, Ltd., Tokyo, Japan

[22] Filed: Oct. 10, 1972

[21] Appl. No.: 295,839

[30] Foreign Application Priority Data

| | | |
|---|---|---|
| Dec. 29, 1971 | Japan | 46-3477 |
| Oct. 8, 1971 | Japan | 46-78653 |
| Oct. 8, 1971 | Japan | 46-78659 |
| Oct. 13, 1971 | Japan | 46-80141 |

[52] U.S. Cl. .................... 340/146.1 AB, 340/365 E

[51] Int. Cl. ..................... G06f 11/00, H03k 13/32

[58] Field of Search.... 340/146.1, 146.1 AB, 365 E, 340/365 S; 235/153 A; 178/17 A, 17 C

[56] References Cited

UNITED STATES PATENTS

| | | | |
|---|---|---|---|
| 3,456,077 | 7/1969 | Jones, Jr. | 340/365 E |
| 3,683,370 | 8/1972 | Nagano et al. | 340/365 E |
| 3,717,871 | 2/1973 | Hatano et al. | 340/365 E |
| 3,721,976 | 3/1973 | Kuijsten | 340/365 E |

*Primary Examiner*—Charles E. Atkinson
*Attorney, Agent, or Firm*—Craig & Antonelli

[57] ABSTRACT

A novel key input circuit used for electronic apparatus and having a plurality of push-button switches which are operated so as to produce desired information to be fed as an input to the electronic apparatus. The key input circuit comprises a timing pulse generating section, a key switch section having a plurality of key switches, a key input signal gating section, an encoder section, a start pulse generating section and a key input reading section. The sections are so arranged and designed that the occurrence of erroneous signals fed as input signals may be precluded for attaining the enhanced speed of key switch operation even when more than two key switches are operated simultaneously or consecutively.

9 Claims, 26 Drawing Figures

FIG. 8
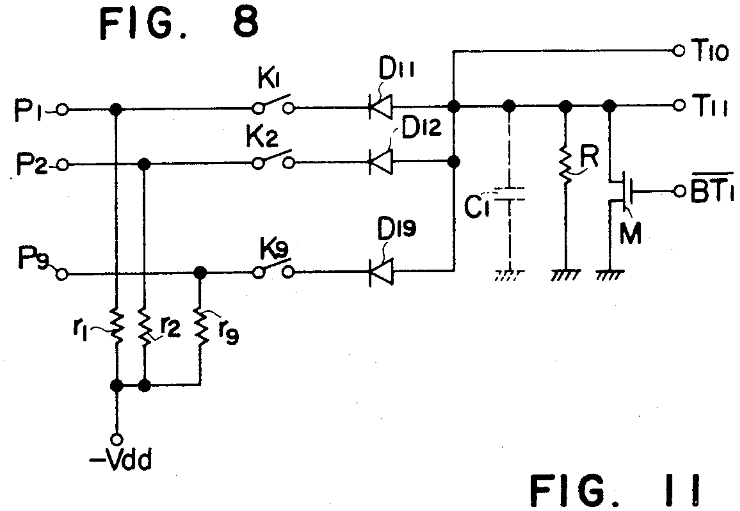
FIG. 9a
FIG. 9b
FIG. 9c
FIG. 9d
FIG. 11
| KEY SWITCH | K1 | K2 | K3 | K4 | K5 | K6 | K7 | K8 | K9 | K10 | K11 | K12 | K13 | K14 | K15 |
|---|---|---|---|---|---|---|---|---|---|---|---|---|---|---|---|
| INFORMATION | 1 | 2 | 3 | 4 | 5 | 6 | 7 | 8 | 9 | 0 | • | X | ÷ | += | −= |
| INPUT SIGNAL | 0001 | 0010 | 0011 | 0100 | 0101 | 0110 | 0111 | 1000 | 1001 | 1010 | 1011 | 1100 | 1101 | 1110 | 1111 |

KEY INPUT CIRCUIT SYSTEM FOR ELECTRONIC APPARATUS

This invention relates to the key input circuit used for electronic apparatus such as electronic desk top calculators.

The key input circuit that is used in electronic apparatus usually includes a plurality of push-button switches, which are operated so as to produce desired information to be fed as an input to the electronic apparatus.

Figure 1:
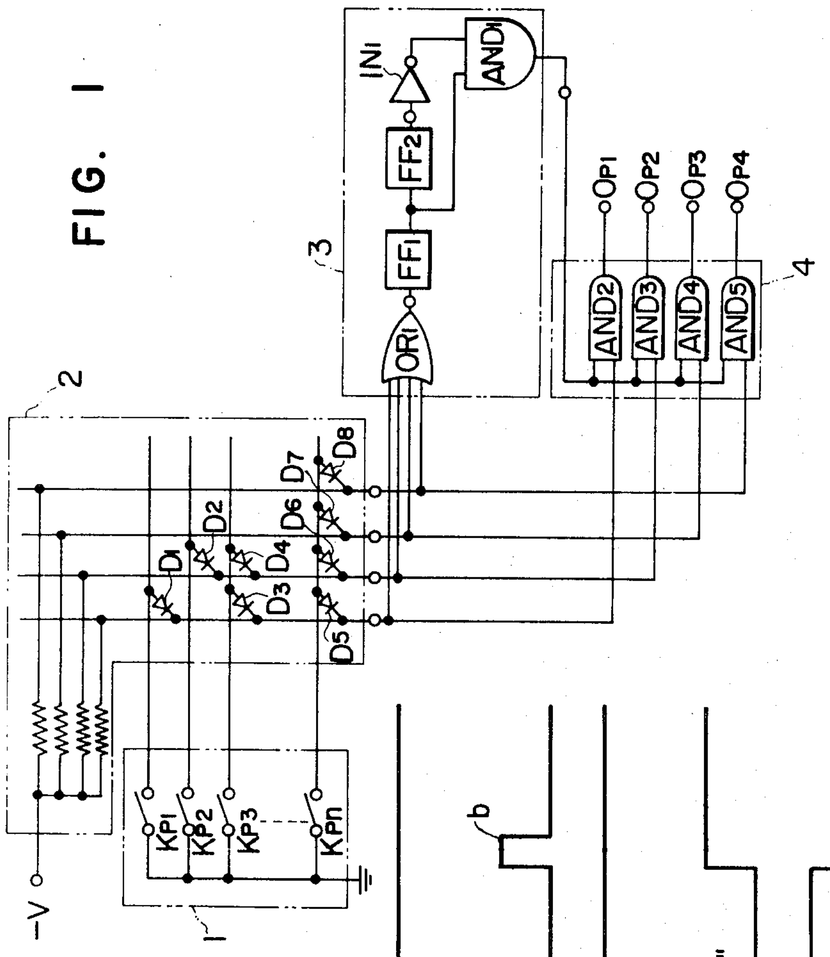

The construction of a typical prior-art key input circuit is shown in FIG. 1. It includes a key switch section 1 consisting of a plurality of key switches $Kp_1$ to $Kp_n$, which are commonly connected at their one end. As these key switches $Kp_1$ to $K_{pn}$ are operated, the corresponding output of the key switch section 1 is coupled to a corresponding input terminal of an encoder section 2 consisting of a plurality of diodes $D_1$ to $D_8$ organized into a diode matrix for decimal-to-binary conversion. The binary output of the encoder 2 is coupled to a start pulse generating section 3, which comprises an OR gate $OR_1$, first and second flip-flops $FF_1$ and $FF_2$ connected in cascade to the output terminal of the OR gate $OR_1$, an inverter $IN_1$ connected to the output terminal of the second flip-flop $FF_2$ and an AND gate $AND_1$ receiving the output of the first flip-flop $FF_1$ and the output of the inverter $IN_1$. The flip-flops $FF_1$ and $FF_2$ are triggerred by the output of a clock pulse source (not shown) for their writing and reading operations, and they are reset in their initial conditions "O" and "O". The start pulse generating section 3 produces an output only for the first input pulse, and it will produce no output for consecutive input pulses of the same sign, such as "0" and "0" or "1" and "1". The output of the encoder section 2 is also coupled to a key input reading section 4 consisting of AND gates $AND_2$ to $AND_5$. When the start pulse generating section 3, whose output is connected to a control input terminal of each of the AND gates $AND_2$ to $AND_5$, produces output "1", the AND gates $AND_2$ to $AND_5$ are opened, so that the output signal of the encoder section 2 is permitted to pass through the AND gates $AND_2$ to $AND_5$ and is coupled to the following circuit through output terminals $OP_1$ to $OP_4$.

Figures 2A, 2B, 2C, 2D, 2E:
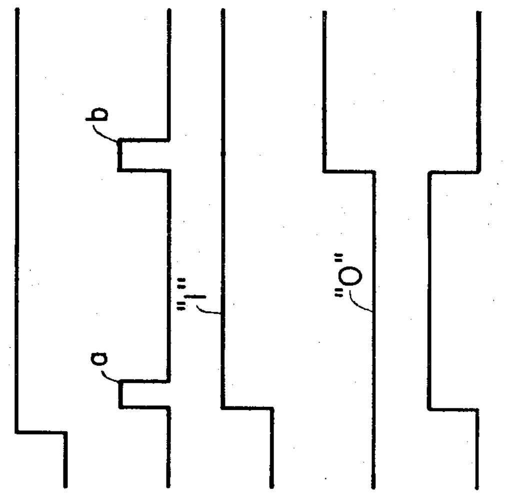

In the operation of the key input circuit of the above construction, when one of the key switches, for instance key switch $Kp_1$, is closed, a signal as shown in FIG. 2*a* is produced and coupled through the encoder section 2 and OR gate $OR_1$ to the first flip-flop $FF_1$. Then the first and second flip-flops $FF_1$ and $FF_2$ are switched into their respective states of "1" and "0" in synchronism with a pulse *a* of the clock pulse series, as shown in FIG. 2b, and subsequently is switched into their respective states of "1" and "1" upon appearance of a second clock pulse *b* of FIG. 2*b*, as shown in FIGS. 2c and 2d. The start pulse generator 3 produces an output signal "1" during the period from the leading edge of the first clock pulse *a* till the leading edge of the second clock pulse *b*, as shown in FIG. 2e. During this period, the AND gates of the key input reading section 4 are held open and permit the output of the encoder 2 to the next-stage circuit. Thereafter, unless the key switch $Kp_1$, is opened, the flop-flops $FF_1$ and $FF_2$ remain in their states of "1" and "1", so that the AND gate $AND_1$ remains to provide output "0". In the long run, the key signal is read in only once for a constant period.

With the above key input circuit, however, if a plurality of key switches, for instance key switches $Kp_1$ and $Kp_2$, are simultaneously closed, an erroneous signal, in this case the same signal that would be produced by closing key switch $Kp_3$, is produced. This erroneous signal will actuate the start pulse generating section, so that it will be read in and coupled to the following circuit.

Also, as mentioned earlier unless all the key switches are restored, a subsequent key switch signal cannot be read in. For example, operating a key simultaneously with the restoring of a previously operated key switch, has the same effect as when two successive signals "1" are supplied to the first flip-flop $FF_1$. In such case, therefore, the latter key switch signal cannot be read in. This means that the speed of the key switch operation is limited.

The aforementioned erroneous signal resulting from simultaneously operating a plurality of key switches constitutes a disadvantage in most practical uses. However, key input circuits similar to the above prior art system are required in certain applications.

Apart from the above operation of the key input circuit, it is a recent trend to incorporate as much integrated circuitry as possible into the electric circuit portion of electronic apparatus, such as electronic desk top calculators, either in individual functional sections or in the whole functional part, in order to meet the demands of improving the economy and reliability and reducing the size and manufacturing steps. This would, however, dictate complicating the circuit construction of the integrated circuit unit and increasing the number of terminal pins led from the integrated circuit package. However, increasing the number of terminal pins would lead to increased package volume because there are limitations upon the distance between adjacent terminal pins. Conversely, with a limited number of terminal pins the integrated circuit within a single package may not have as much complicated functions as desired.

In case of the above prior art key input circuit of FIG. 1, although it may be fabricated as an integrated circuit, except for its mechanical parts, such as keys, the package of the integrated circuit unit would at least require input terminal pins individually corresponding to the respective keys.

An object of the present invention is to provide a key input circuit, in which erroneous signals are prevented from being read in as a result of simultaneously operating a plurality of keys.

Another object of the invention is to provide a key input circuit which permits continuous key operation.

A further object of the invention is to provide a key input circuit which permits high speed key operation.

Still another object of the invention is to provide a compatible or general-purpose key input circuit which may be used either as an improved key input circuit or a prior-art key input circuit with slight modifications in the key input section.

Still a further object of the invention is to provide a key input circuit, which can be inexpensively realized.

A yet further object of the invention is to provide a key input circuit unit as an integrated circuit having a reduced number of terminal pins.

Figure 3:
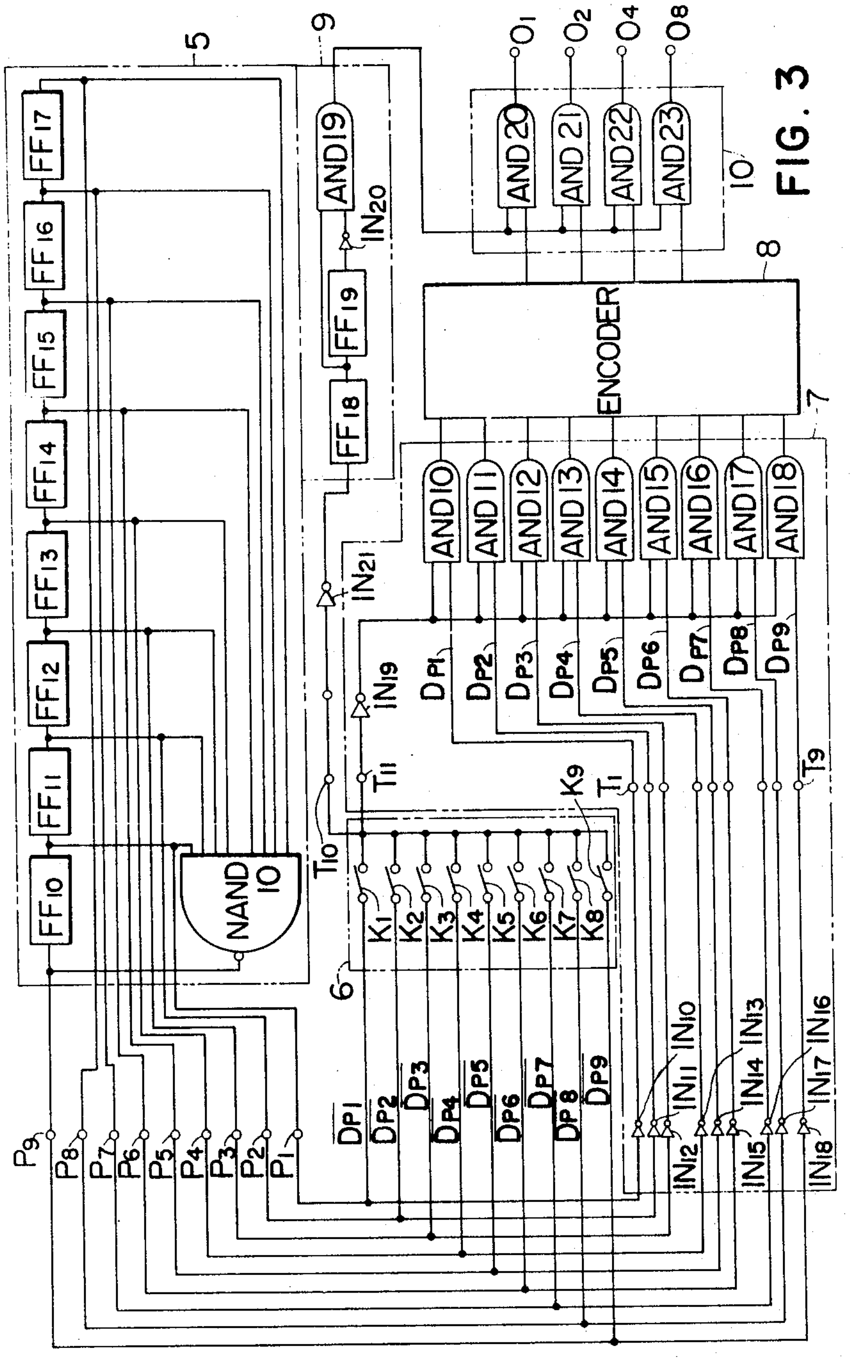
Figures 4A, 4B, 4C, 4D, 4E, 4F, 4G, 4H, 4I:
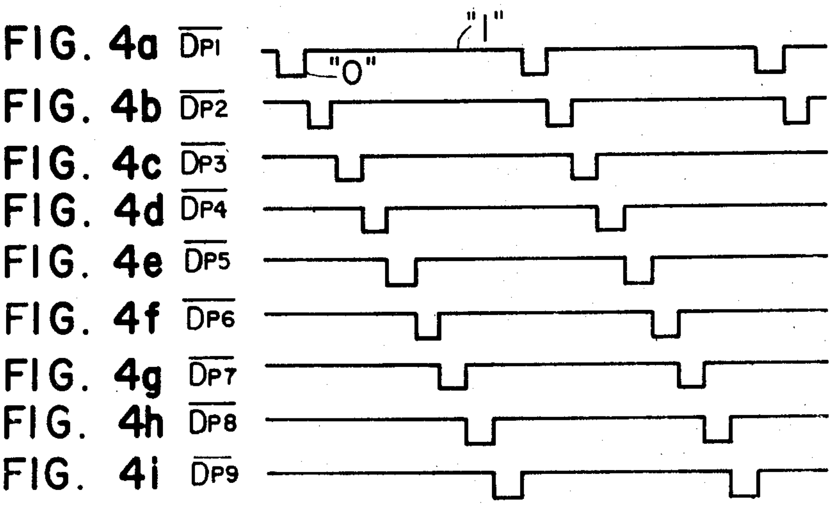

The above and other objects, features and advantages of the invention will become more apparent from the following description of preferred embodiments of the key input circuit and integrated circuit including the same, when read with reference to the accompanying drawings, in which:

FIG. 1 is a schematic circuit diagram of the aforementioned prior-art key input circuit;

FIG. 2, comprised of FIGS. *2a–2e*, is a waveform chart to illustrate the operation of the circuit of FIG. 1;

FIG. 3 is a schematic circuit diagram of an embodiment of the key input circuit according to the invention;

FIG. 4, comprised of FIGS. *4a–4l*, is a waveform chart showing waveforms provided in various parts of the circuit of FIG. 3;

FIGS. 5 to 8 and 10 are schematic circuit diagrams showing other embodiments of the invention;

FIG. 9, comprised of FIGS. *9a–9d*, is a waveform chart to illustrate the operation of the circuit of FIG. 8; and FIG. 11 is a chart for the circuit of FIG. 9.

Referring now to FIG. 3, which shows a key input circuit embodying the invention, a timing pulse generating section 5 comprises eight flip-flops $FF_{10}$ to $FF_{17}$ connected in cascade, a NAND circuit $NAND_{10}$ receiving the outputs of the flip-flops $FF_{10}$ to $FF_{17}$ and feeding its output back to the input terminal of the flip-flop $FF_{10}$ and output terminals $P_1$ to $P_9$ respectively connected to the output terminals of the flip-flops $FF_{10}$ to $FF_{17}$ and the output terminal of the NAND circuit $NAND_{10}$. This circuit thus constitutes a ring counter, and nine different timing pulse series, as shown in FIG. 4, appear at the respective output terminals $P_1$ to $P_9$. In this embodiment, the logic signal "1" corresponds to the ground potential, and the logic signal "0" corresponds to a predetermined negative potential.

A key switch section 6 consists of key switches $K_1$ to $K_9$, which have their input terminals connected to the respective output terminals $P_1$ to $P_9$ of the timing pulse generator 5 and their output terminals connected in common. These key switches $K_1$ to $K_9$ are in charge of respective decimal numbers 1 to 9.

Numeral 7 designates a key input signal gating section. In this section, the timing pulse signals provided from the output terminals $P_1$ to $P_9$ of the timing pulse generator 5 are inverted through respective inverters $IN_{10}$ to $IN_{18}$, whose outputs are added to respective AND gates $AND_{10}$ to $AND_{18}$. Also, the output of the key switch section 6 is inverted through a further inverter $IN_{19}$, whose output constitutes another input to the AND gates $AND_{10}$ to $AND_{18}$.

Numeral 8 designates an encoder section for encoding the decimal number output of the key input signal gating section 7 into a corresponding binary number. This encoder section may be of any conventional form, such as the diode matrix arrangement of the type described in FIG. 1.

Numeral 9 designates a start pulse generating section consisting of first and second delay type flip-flops $FF_{18}$ and $FF_{19}$ connected in cascade, an inverter $IN_{20}$ to invert the output of the second flip-flop $FF_{19}$ and an AND gate $AND_{19}$ receiving the output of the first flip-flop $FF_{18}$ and the output of the inverter $IN_{20}$.

Numeral 10 designates a key input reading section, through which the coupling of the output of the encoder section 8 to the following circuit is controlled. It consists of AND gates $AND_{20}$ to $AND_{23}$, which are on-off controlled by the output of the start pulse generating section 9, and whose outputs appear at respective output terminals $O_1$, $O_2$, $O_4$ and $O_8$ which are coupled to the following circuit.

The operation of the key input circuit of the above construction for the case when the key switches $K_1$ to $K_9$ are separately operated one after another, for the case when a plurality of key switches are simultaneously operated and for the case when the key switches are continually operated will now be described.

A. In case of operating the key switches separately one after another;

The flip-flops $FF_{10}$ to $FF_{17}$ and the NAND gate $NAND_{10}$, which constitute a ring counter as mentioned earlier, generate a respective timing pulse series $Dp_1$ to $Dp_9$ of different phases as shown at (*a*) to (*i*) of the chart of FIG. 4, with the signal "0" progressively shifted toward the right as we go toward the bottom of the chart.

When a key switch in the key switch section 6, for instance key switch $K_1$, is operated, only the output signal of the timing pulse generator 5 appearing at the output terminal $P_1$ thereof (pulse series (*a*) shown in FIG. 4) is supplied to the key input signal gating section. The output of the key switch section 6 thus provided is inverted through the inverter $IN_{19}$ and is then added to the individual AND gates $AND_{10}$ to $AND_{18}$. Meanwhile, the timing pulse signal $\overline{Dp_1}$ that is synchronized to the output of the key switch section 6 is added only to the AND gate $AND_{10}$ via inverter $IN_{10}$ and line $Dp_1$. Thus, only the AND gate $AND_{10}$ produces output "1". The output thus provided from the key input signal gating section 7, which corresponds to the decimal number "1", is coupled to the encoder 8 for decimal-binary conversion.

The output of the key switch section 6 produced in response to the operation of the key switch $K_1$ is also added through the inverter $IN_{21}$ to the start pulse generating section 9. As a result, the first and second flip-flops $FF_1$ and $FF_2$, which have previously been in the reset states "0", "0", are switched into their first set state "1", "0" and then into their second set state "1", "1", so that the AND gate $AND_{19}$ provides output "1" to the AND gates $AND_{20}$ to $AND_{23}$ of the key input signal reading section 10. Thus, the AND gates $AND_{20}$ to $AND_{23}$ are opened to permit transfer of their binary signal contents "1", "0", "0" and "0", corresponding to the decimal number "1", to the respective output terminals $O_1$, $O_2$, $O_4$ and $O_8$.

Thereafter, unless the key switch $K_1$ is opened, the flip-flops $FF_1$ and $FF_2$ remain in their state "1", "1", so that the AND gates of the key input signal reading section 10 will remain closed. So long as this state holds, any subsequent key signal output will not be transferred to the output terminals $O_1$ to $O_8$.

B. In case of simultaneously operating a plurality of key switches:

When a plurality of key switches in the key switch section 6, for instance key switches $K_1$ and $K_2$, are simultaneously operated, the signals shown at (*a*) and (*b*) in FIG. 4 are synthesized. Therefore, the output of the key switch section 6 is forced to the ground potential level first of the timing pulse $\overline{Dp_2}$ and then of the timing pulse $\overline{Dp_1}$, so that output signal "1" continually prevails for the total period of these pulses. In other words, when a plurality of key switches are simultaneously operated, the timing pulses due to the individual operative key switches are affected by one another, so that a "0" output signal does not appear at the output of key switch section 6, and therefore information as to which key is depressed will not be transmitted to the key input signal gating section 7. In this way, when two or more of the key switches $K_1$ to $K_9$ are simultaneously operated, the key input signal gating section 7 acts to block whatever key input signal is generated.

C. In case of continually operating key switches:

This example comprises first closing key switch $K_1$, subsequently closing key switch $K_2$ and then opening the key switch $K_1$ while holding the key switch $K_2$ closed. By closing the sole key switch $K_1$, similar to the case (A) the flip-flops $FF_1$ and $FF_2$ are shifted from their reset state "0", "0" to the first set state "1", "0" and then to the second set state "1", "1", so that the binary signal corresponding to the decimal number "1" appears only once for a constant period in the key input signal reading section 10.

With subsequent closure of the key switch $K_2$, similar to the case (B) the output of the key switch section 6 continues to be "1", so that no key input signal is transferred to the key input signal gating section 7. Also, the flip-flops $FF_1$ and $FF_2$ are reset to "0", "0".

By subsequently opening the key switch $K_1$, the timing pulse signal $\overline{Dp_2}$ from the key switch $K_2$ becomes free of the effect of any other timing pulse signal. Thus, the flip-flops $FF_1$ and $FF_2$ are again shifted from their reset state "0", "0" to the first set state "1", "0" and then to the second set state "1", "1", so that the binary signal this time corresponding to the decimal number "2" appears at the output terminals $O_1$ to $O_8$ of the key input signal reading section 10.

It is to be appreciated that according to the above embodiment, simultaneously closing two or more keys is equivalent to opening all the keys. Thus, even if two keys are operated continually in the above manner, the key signal corresponding to the subsequently closed key can be read out at the instant of opening the previously closed key.

With the above circuit construction, which permits reading of key switch signals even if two or more key switches are continually operated, it is possible to increase the speed of the key operation.

The above logic circuit may be constructed with well-known switching elements, such as transistors and MOS transistors. In the above embodiment, the timing pulse generating section 5, key input signal gating section 7, encoding section 8, start pulse generating section 9 and key input signal reading section 10 are fabricated as a semiconductor integrated circuit consisting of MOS transistors within a single package.

The above key input circuit and the following operational circuit may be controlled by timing pulses (clock pulses) of the same system to simplify the circuit construction. To this end, these circuits may be fabricated as semiconductor integrated circuits in a single package. The above key input circuit may be realized as an integrated circuit except for the key switch section 7 involving mechanical operation.

According to the preceding embodiment, the number of terminal pins required for coupling the ket input signals from the keys $K_1$ to $K_9$ to the integrated circuit within the package can be reduced to only one.

The electronic desk top calculator includes, in addition to the key input circuit section, the following operational section and indicating section to indicate the operational results. These sections commonly use some parts that may be commonly used. As the indicators of the indicating section luminescent indicator tubes, luminescent indicator elements, typewriter keys and so forth may be used. The indication is provided in terms of decimal numbers of a plurality of places, for which the corresponding number of indicators are used. Presently, the so-called dynamic systems are extensively used as the indicating system. In these systems, a single decoder is used to derive decimal numbers from corresponding binary inputs. The output of the decoder is distributed among a plurality of indicators individually responsible for respective decimal places in each one of unit time divisions. If the maximum number of places of the decimal number to be indicated by the dynamic indicating system is nine, for instance, nine indicators are required. This means that nine switches are required for driving the nine indicators with the output of the single decoder. To this end, at least nine different pulse series of different phases are required to on-off operate the switches. If ten pulse series are used for the nine place decimal number indication, one of these pulse series is not used for the purpose of driving any indicator.

In the preceding embodiment, the nine pulses series added to the respective nine key switches $K_1$ to $K_9$ may be used commonly for driving nine indicators. Thus, the integrated circuit package requires only a single terminal pin to receive the key input signals from the key switches $K_1$ to $K_9$.

In contrast, if the prior-art key input circuit of FIG. 1 is fabricated as an integrated circuit, nine terminal pins are required for the respective nine key switches $K_1$ to $K_9$.

The output terminals $P_1$ and $P_9$ of the timing pulse generating circuit 5 in the preceding embodiment may be fanned out for the purpose of using the timing pulse series $\overline{Dp_1}$ to $\overline{Dp_9}$ provided from the timing pulse generating circuit 5 not only in the key input circuit of FIG. 3 but also for the switching of places in the dynamic indicating system and for the control of arithmetic operations. In such cases, it is necessary to prevent the operation of key switches from affecting the switching of places and arithmetic operation control. To this end, use may be made of diodes. These diodes, if the connection thereof (as to their polarity and so forth) is properly selected, make it possible to obtain a versatile key input circuit, which permits one to obtain different key input signals by operating the same key.

Figure 5:
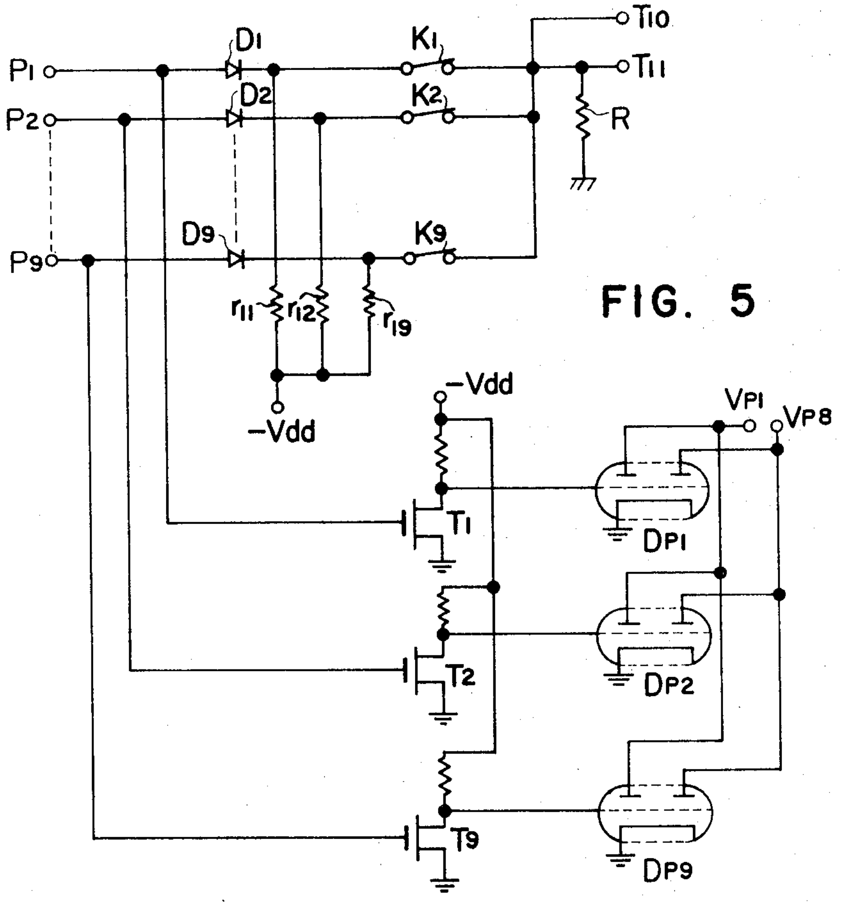

FIG. 5 shows an embodiment, which is a development of the preceding FIG. 3 embodiment. In this embodiment, the timing pulse series $\overline{Dp_1}$ to $\overline{Dp_9}$ is used in an indicating circuit as well as in the key input circuit. In FIG. 5, the same parts as in FIG. 3 are designated by like reference symbols. In the present embodiment, the key switches $K_1$ to $K_9$ are connected through respective diodes $D_1$ to $D_9$ to the associated timing pulse generator output terminals $P_1$ to $P_9$. Resistors $r_1$ to $r_9$ are connected at their one end to the anode side of the respective diodes $D_1$ to $D_9$ and at their other end commonly to the negative side of a voltage source. They are load resistors for respective MOS transistors in the open drain form (not shown) within the timing pulse generator, and they also serve to shape the respective pulse signals. Other resistors $r_{11}$ to $r_{19}$ are connected at their one end to the cathode side of the respective diodes $D_1$ to $D_9$ and at their other end commonly to the negative side of the voltage source. The anode side of the diodes $D_1$ to $D_9$ are also connected to the gate of respective MOS transistors $T_1$ to $T_9$, whose outputs are coupled to respective luminescent indicator tubes $Dp_1$ to $Dp_2$. The terminal $T_{11}$ is grounded through a resistor R of high resistance (noise prevention resistance) for preventing unnecessary information from being stored at the terminal $T_{11}$ when all the key switches $K_1$ to $K_9$ are opened after coupling a key input.

Although not shown in the Figure, the luminescent indicator tubes individually have a plurality of anode electrodes arranged into a suitable form of indicia. The anode electrodes glow when an anode voltage is impressed on them in the "on" state of the indicator tube. Accordingly, the anode electrodes may be held at a suitable anode potential, and by turning on the indicator tubes suitable characters can be displayed. Anode electrodes of common configuration and arrangement in the individual indicator tubes are commonly connected, and the individual anode electrode groups are connected to respective terminals $Vp_1$ to Vphd 8. A suitable voltage is selectively applied to the terminals $Vp_1$ to $Vp_8$ according to the information within the operational circuit. The indicator tubes are successively scanned by the timing pulses aforementioned, so that they will intermittently glow. The character displayed may be viewed as a continuous image due to the residual effect of the discharge.

It will be noted that with the above construction the timing pulse series (place switching signals) $\overline{Dp_1}$ to $\overline{Dp_9}$ is free from any effect of operation of the key switches $K_1$ to $K_9$. Without the diodes $D_1$ to $D_9$, by depressing two or more of the keys $K_1$ to $K_9$ simultaneously all the digit signals added to the depressed keys are forced to the level "1" of ground potential. During this time, therefore, the indicating section would stay inoperative. With the diodes $D_1$ to $D_9$ in the present embodiment, however, even when the potential on the terminal $T_{10}$ is brought to ground potential (level "1") by simultaneously depressing two or more keys, the digit signal of negative level "0" at this time will not be switched to ground level since the corresponding diode is reversely biased. Thus, the indicator unit will be operative and indicate any given information.

Also, with the above diode connection by simultaneously closing two or more key switches the terminal $T_{10}$ comes up with level "1". Thus, like the previous embodiment of FIG. 3, the continual key operation is possible, and no erroneous key input signal will be coupled.

Figure 6:
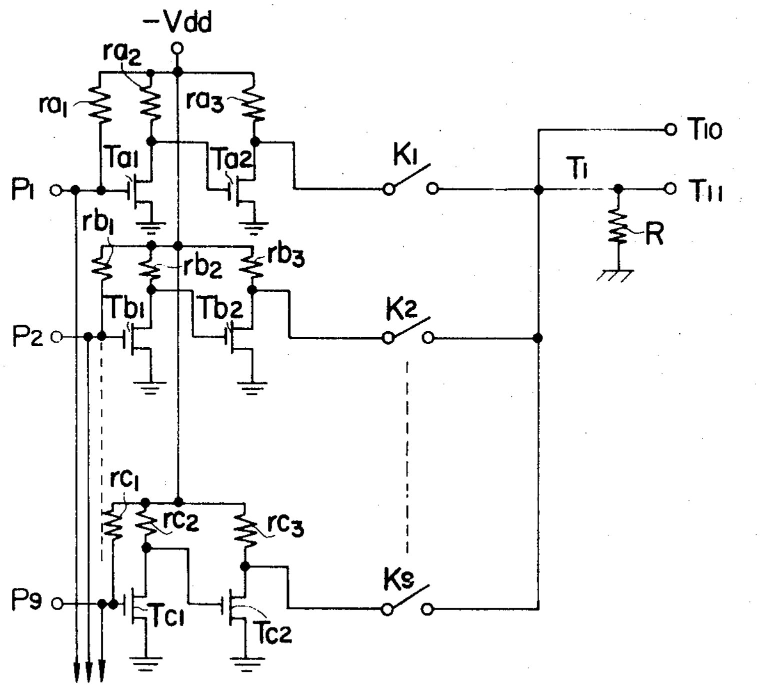

FIG. 6 shows another developement of the key switch section 6 shown in FIG. 3. In FIG. 6, the same parts as in FIG. 3 are designated by like reference symbols. It includes MOS transistors $Ta_1$, $Ta_2$, . . . , $Tc_2$ and resistors $ra_1$, $ra_2$, $ra_3$, . . . , $rc_3$. This circuit construction constitutes a buffer circuit between output terminals $P_1$ to $P_9$ and key switches $K_1$ to $K_9$. It is a substitute for the construction of the diodes $D_1$ to $D_9$, and its function is basically the same as that of the circuit of FIG. 5. Similar to the circuit of FIG. 5, the terminal $T_{11}$ is grounded through a resistor of high resistance for preventing noise from appearing at the terminal when all the key switches are opened after coupling a key input.

With this construction, similar to the construction of FIG. 5, the continual key operation is possible, and no erroneous key input signal will be coupled.

Figure 7:
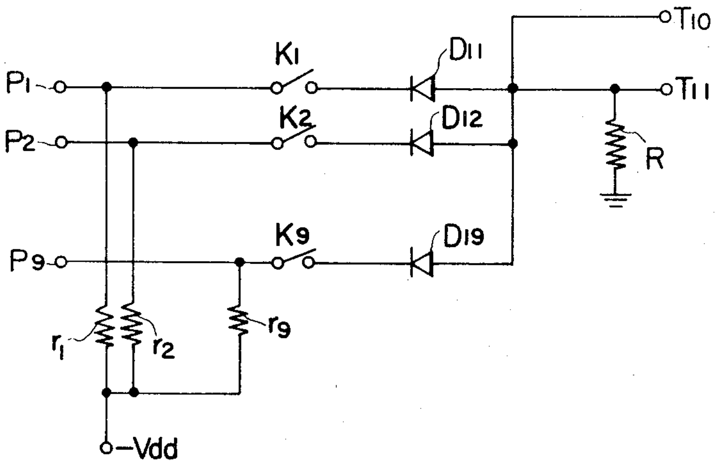
Figure 10:
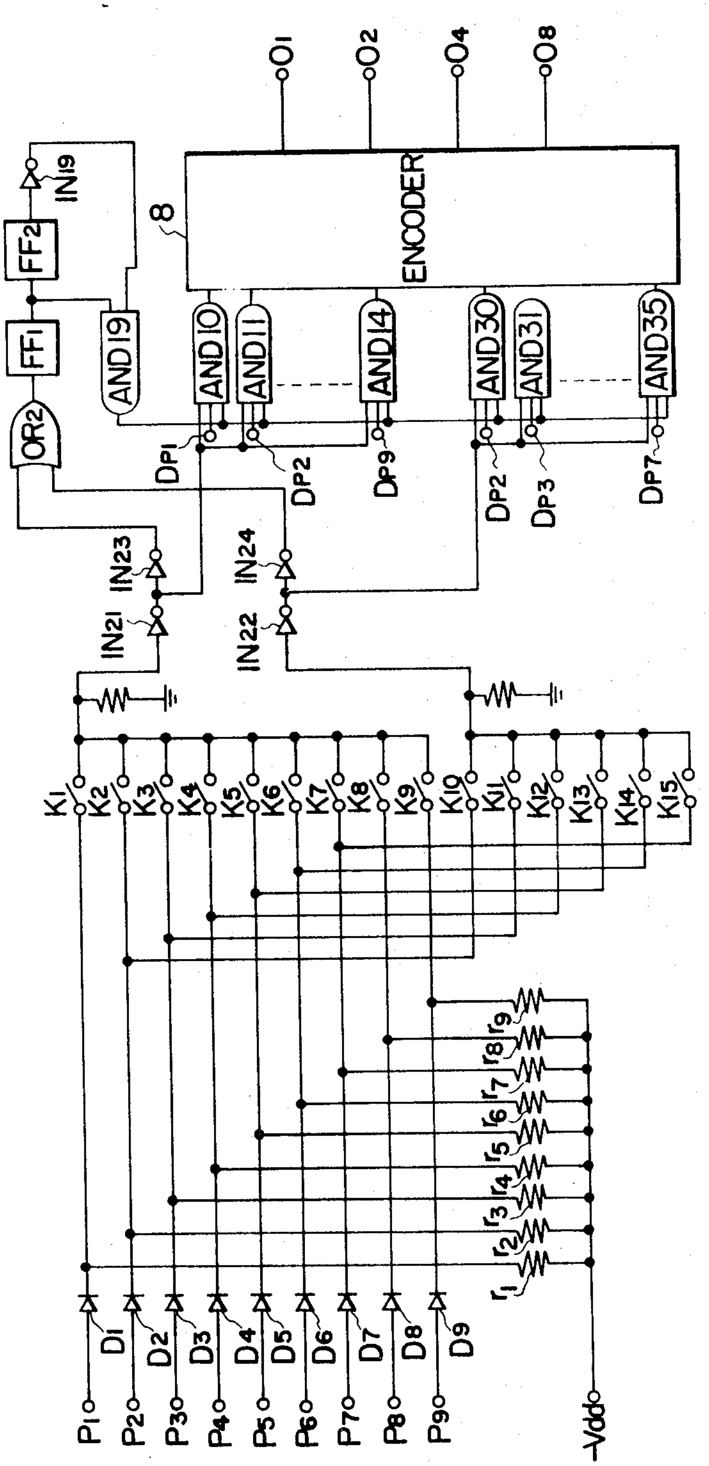

FIG. 7 shows a further development of the key switch section. Its chief difference from the construction of FIG. 6 is that diodes $D_{11}$ to $D_{19}$ are connected between respective keys $K_1$ to $K_9$ on one hand and terminal $T_{11}$ on the other hand, with the diode polarity being opposite to that of the diodes shown in FIG. 5.

With this construction, even if a plurality of keys are simultaneously depressed, the potential on the terminal $T_{11}$ will not be forced to ground potential. For example, if keys $K_1$ and $K_2$ are simultaneously depressed, during a certain period of time the digit signal $Dp_1$ is at a negative level ("0") while the digit signal is grounded level. As these signals are added to the respective diodes $D_{11}$ and $D_{12}$, the diode $D_{11}$ carries current so that the terminal $T_{10}$ comes up with a negative potential, while the diode $D_{12}$ is reversely biased to prevent the digit signal $Dp_2$ of ground potential at this time from affecting the terminal $T_{11}$. A similar condition holds during the next period, during which the states of the digit signals $Dp_1$ and $Dp_2$ are interchanged. After all, similar to the key input circuit of FIG. 1, both pulses of the digit signals $Dp_1$ to $Dp_2$ appear in multiplex on the terminal $T_{10}$.

Also, with this construction it is of course possible to fan out the terminals $P_1$ to $P_9$. Here, however, between the terminal $T_{11}$ and ground there is present an equivalent capacitance due to, for instance, gate capacitance of an inuslated-gate filed-effect transistor (IGFET) connected to the terminal $T_{11}$ and a floating capacitance, such as a lead capacitance. If this equivalent capacitance is too large, the waveform of the pulse signal appearing at the terminal $T_{11}$ is prone to distortion due to the diodes $D_{11}$ to $D_{19}$.

FIG. 8 shows a further embodiment, which can overcome the above problem. In the Figure, the same parts as in FIG. 7 are designated by like reference symbols. The reference character Ci represents the aforementioned equivalent capacitance between terminal $T_{11}$ and ground, and character R represents a noise prevention high resistance, as mentioned earlier. Connected in parallel with the resistance R is an insulated gate field-effect transistor M, to whose gate electrode a bit signal $\overline{Bt_1}$ is impressed.

In operation, when a key switch, for instance key switch $K_1$, is closed, a digit signal as shown in FIG. 9a appears on the cathode side of the diode $D_{11}$. In FIG. 9, the upper level of the individual signals corresponds to the ground potential, and the lower level corresponds to a negative potential. When the digit signal $Dp_1$ is switched from a predetermined negative level to the ground potential level, the charge stored due to the equivalent capacitance Ci cannot be discharged through the diode $D_{11}$ since the diode $D_{11}$ is in the reverse bias state, so that it is discharged through the noise prevention high resistor R. The resistance of the resistor R is set to a high value and cannot be reduced in order to ensure sufficient operation of the next-stage logic gate circuit.

Unless the insulated-gate field-effect transistor M is provided, therefore, the voltage waveform appearing on the anode side of the diode $D_{11}$, that is, at the terminal $T_{11}$, is distorted at a high time constant of $\tau = CiR$. If such distorted waveform appears at the terminal $T_{11}$, in spite of operating the key switch $K_1$ digit signals $Dp_1$ and $Dp_2$ equivalently appear, which would have the same effects as if both switches $K_1$ and $K_2$ were operated and would lead to malfunctioning, with the encoder providing output that would be produced if switch $K_3$ is operated.

The insulated-gate field-effect transistor M connected in parallel with the resistor R serves to prevent the malfunctioning due to the aforementioned waveform distortion. It is triggered by the bit signal $\overline{Bt_1}$ shown in FIG. 9c to rapidly discharge the charge stored due to the equivalent capacitance $Ci$. Thus, a waveform as shown in FIG. 9d appears at the terminal $T_{11}$, so that the malfunctioning can be prevented.

The pulse width of the bit signal $\overline{Bt_1}$ corresponds to one-fourth of the pulse width of the digit signals $Dp_1$ to $Dp_n$, and the pulse repetition period of the bit signal is the same as the pulse width of the digit signals $Dp_1$ to $Dp_n$. Together with the bit signal $Bt_1$, other bit signals $Bt_2$ to $Bt_4$ of the same pulse width and the same pulse repetition period, but of different phases, are used in electronic desk top calculators and the like. These bit signals $Bt_1$ to $Bt_4$ may also be used for converting the parallel binary signal taken out of the encoder into a corresponding series binary signal, for the control of arithmetic operations and for other purposes. In the above embodiment of FIG. 8, it is possible to make direct use of the bit signals used in electronic desk top calculators and the like for the waveform shaping in the above manner.

While the pulse width of the signal appearing at the terminal $T_{11}$ is reduced to three-fourths of the digit signal pulse width as shown in FIG. 9*c*, this gives rise to a practical problem, since the writing operation in a memory circuit connected after the key input signal reading section 10 shown in FIG. 3 can be performed in short periods.

While the preceding FIG. 8 embodiment has used an insulated-gate field-effect transistor for the purpose of waveform shaping, the same effect may also be obtained with a bipolar transistor. More particularly, the emitter and collector electrodes of the transistor may be connected across the resistor R, and bit signal $\overline{Bt_1}$ may be impressed upon the base electrode.

As has been described in the foregoing, according to the invention it is possible to provide a key input circuit, from which either an improved key input circuit or the prior-art key input circuit may be readily realized with mere slight modifications in the key switch section. This means that according to the invention it is possible to manufacture a plurality of different key input circuits at the same time, which is extremely beneficial from the standpoint of simplifying the manufacturing equipment and reduction of manufacturing steps, and hence reduction of the manufacturing cost.

Also, with the improved key input circuit according to the invention, when a plurality of keys are simultaneously operated, the key input signal gating section acts to prevent any key switch signal from being read in so as to perfectly prevent erroneous signals.

Further, according to the invention the key switch signals are coupled on a time division basis, so that even by the continual key operation exact signals can be fed in. Thus, it is possible to extremely increase the speed of the key operation.

Furthermore, according to the invention the distortion of the output waveform of the key switch section output due to connection of diodes can be prevented.

What we claim is:

1. A key input circuit comprising timing pulse generating means for providing a plurality of pulse outputs of different pulse phases from respective output terminals, a key switch section consisting of a plurality of key switches each having one terminal connected to a corresponding one of said output terminals of said timing pulse generating means and the other terminal connected commonly to the like terminals of the other key switches, key input signal gating means for controllably passing key input signals under the control of the outputs of said timing pulse generating section and the output of said key switch section, encoder means connected to the output of said key input signal gating means for converting said output into a corresponding binary signal, start pulse generating means for producing a start pulse output on the basis of the output of said key switch section, and key input reading means connected to the output of said encoder means and to the output of said start pulse generating means for selectively transferring the output of said encoder means to respective outgoing terminals under the control of the output of said start pulse generating means.

2. A key input circuit as defined in claim 1, wherein said timing pulse generating means is provided in the form of a ring counter generating a plurality of sequential pulse outputs on respective lines to said output terminals.

3. A key input circuit as defined in claim 2, wherein said key input signal gating means includes a plurality of AND gates each having one terminal connected to the common connection of said key switches and a second terminal connected to a respective one of the output terminals of said timing pulse generating means.

4. A key input circuit as defined in claim 3, wherein said start pulse generating means includes a first flip-flop connected to said common connection of said key switches, a second flip-flop connected to the output of said first flip-flop, and an AND gate having one input connected to the output of said first flip-flop and a second input connected to the output of said second flip-flop through an inverter.

5. A key input circuit as defined in claim 2, wherein said ring counter sequential applies a polarity signal to otherwise normally grounded lines connected to said output terminals so that a ground potential pulse output will appear at said common connection of said key switches when two or more key switches are simultaneously operated.

6. A key input circuit as defined in claim 1, wherein at least said timing pulse generating means, said key input signal gating means, said encoder means and said start pulse generating means are provided in the form of a semiconductor integrated circuit.

7. A key input circuit as defined in claim 1, wherein a plurality of indicating devices are connected individually to respective output terminals of said timing pulse generating means via respective semiconductor control devices.

8. A key input circuit as defined in claim 1, wherein a noise prevention resistor is connected between said common connection of said key switches and ground.

9. In a key input circuit including a plurality of key switches and means to couple timing pulses of different phases to one end of said respective key switches, the improvement comprising diodes connected in series with said respective key switches, means to couple pulse signals passed through respective ones of said key switches to a common terminal, and means to ground said common terminal when the state of said plurality of timing pulses changes.

* * * * *